(12) United States Patent
Yahagi et al.

(10) Patent No.: US 7,279,211 B2
(45) Date of Patent: Oct. 9, 2007

(54) SPUTTERING TARGET CONTAINING ZINC SULFIDE AS MAJOR COMPONENT, OPTICAL RECORDING MEDIUM ON WHICH PHASE CHANGE OPTICAL DISK PROTECTIVE FILM CONTAINING ZINC SULFIDE AS MAJOR COMPONENT IS FORMED BY USING THE TARGET, AND METHOD FOR MANUFACTURING THE SPUTTERING TARGET

(75) Inventors: Masataka Yahagi, Ibaraki (JP); Hideo Takami, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 544 days.

(21) Appl. No.: 10/503,296

(22) PCT Filed: Dec. 11, 2002

(86) PCT No.: PCT/JP02/12964

§ 371 (c)(1),
(2), (4) Date: Aug. 2, 2004

(87) PCT Pub. No.: WO03/069612

PCT Pub. Date: Aug. 21, 2003

(65) Prior Publication Data
US 2005/0084799 A1 Apr. 21, 2005

(30) Foreign Application Priority Data
Feb. 14, 2002 (JP) .............................. 2002-036154

(51) Int. Cl.
*B32B 3/02* (2006.01)

(52) U.S. Cl. ............... 428/64.1; 428/64.4; 430/270.13; 106/420; 204/298.13

(58) Field of Classification Search ............... 428/64.1, 428/64.4; 430/270.13; 106/420; 204/298.13
See application file for complete search history.

(56) References Cited

U.S. PATENT DOCUMENTS

| | | | | |
|---|---|---|---|---|
| 5,635,310 A | * | 6/1997 | Kudo et al. ............... | 428/824.2 |
| 5,906,874 A | * | 5/1999 | Takahashi et al. ......... | 428/64.1 |
| 6,528,442 B1 | * | 3/2003 | Kuwano et al. ............... | 501/41 |
| 6,656,260 B2 | * | 12/2003 | Ueno et al. .................. | 106/420 |
| 6,854,126 B2 | * | 2/2005 | Hirotsune et al. .......... | 720/719 |
| 7,095,706 B2 | * | 8/2006 | Nakamura et al. .......... | 369/288 |
| 2003/0170504 A1 | * | 9/2003 | Taninaka et al. ............ | 428/702 |

FOREIGN PATENT DOCUMENTS

| | | |
|---|---|---|
| JP | 11-328730 | 11/1999 |
| JP | 2001-011615 | 1/2001 |
| JP | 2001-098361 | 4/2001 |
| JP | 2001-192820 | 7/2001 |
| JP | 2001-316804 | 11/2001 |
| JP | 2001-355065 | 12/2001 |

OTHER PUBLICATIONS

Patent Abstracts of Japan, 1 page English Abstract of JP 2001-355065, Dec. 2001.
Patent Abstracts of Japan, 1 page English Abstract of JP 2001-098361, Apr. 2001.
Patent Abstracts of Japan, 1 page English Abstract of JP 11-328730, Nov. 1999.
Patent Abstracts of Japan, 1 page English Abstract of JP 2001-011615, Jan. 2001.
Patent Abstracts of Japan, 1 page English Abstract of JP 2001-192820, Jul. 2001.
Patent Abstracts of Japan, 1 page English Abstract of JP 2001-316804, Nov. 2001.

* cited by examiner

*Primary Examiner*—Elizabeth Mulvaney
(74) *Attorney, Agent, or Firm*—Howson & Howson LLP

(57) ABSTRACT

Provided is a sputtering target and an optical recording medium having formed thereon a phase change optical disc protective film having zinc sulfide as its principal component employing such a target, as well as the manufacturing method thereof, characterized in that the sputtering target has zinc sulfide as its principal component, and is capable of adjusting the refractive index of a film containing conductive oxide in the range of 2.0 to 2.6. This sputtering target, and an optical recording medium having formed thereon a phase change optical disc protective film having zinc sulfide as its principal component employing such a target, is capable of reducing particles (dust emission) and nodules that arise during sputtering, has minimal variation in quality and is capable of improving mass productiveness, and in which the crystal grain is fine and has a high density of 90% or more.

19 Claims, No Drawings

SPUTTERING TARGET CONTAINING ZINC SULFIDE AS MAJOR COMPONENT, OPTICAL RECORDING MEDIUM ON WHICH PHASE CHANGE OPTICAL DISK PROTECTIVE FILM CONTAINING ZINC SULFIDE AS MAJOR COMPONENT IS FORMED BY USING THE TARGET, AND METHOD FOR MANUFACTURING THE SPUTTERING TARGET

BACKGROUND OF THE INVENTION

The present invention pertains to a sputtering target having zinc sulfide as its principal component which allows direct current (DC) sputtering, which has minimal arcing during the sputtering, and which is capable of reducing particles (dust emission) and nodules upon forming a film with sputtering, and which is of high density and having minimal variation in quality and capable of improving mass productiveness, as well as to an optical recording medium having formed thereon a phase change optical disc protective film having zinc sulfide as its principal component employing this target, and the manufacturing method of such a sputtering target.

In recent years, high-density recordable optical disc technology capable of recording/reproduction without requiring a magnetic head has been developed, and is rapidly attracting attention. This optical disc can be classified into the three categories of reproduction-only, recordable and rewritable. Particularly, the phase change method employed in the recordable and rewritable type discs is attracting attention. The fundamental principle of the recording/reproduction employing this phase change optical disc is briefly described below.

This phase change optical disc performs the recording/reproduction of information by heating and increasing the temperature of a recording thin film on a substrate by irradiating a laser beam thereto, and generating a crystallographic phase change (amorphous⇔crystal) in the structure of such recording thin film. More specifically, the reproduction of information is conducted by detecting the change in the reflectivity caused by the change in the optical constant of the phase.

The aforementioned phase change is performed with the irradiation of a laser beam narrowed down to a diameter of approximately 1 to several µm. Here, for example, when a 1 µm laser beam passes through at a linear velocity of 10 m/s, light is irradiated to a certain point on the optical disc for 100 ns, and it is necessary to perform the aforementioned phase change and detect the reflectivity within such time frame.

Moreover, in order to realize the foregoing crystallographic phase change; that is, the phase change of the amorphous and crystal, not only will the phase change recording layer be subject to fusion and quenching more than once, the peripheral dielectric protective layer and aluminum alloy will also be repeatedly subject thereto.

In light of the above, a phase change optical disc has a four-layer structure wherein, for instance, both sides of a Ge—Sb—Te recording thin film layer are sandwiched with a zinc sulfide-silicic oxide ($ZnS$—$SiO_2$) high-melting point dielectric, and an aluminum alloy reflective layer is additionally provided thereto.

Among the above, in addition to being demanded of an optical function capable of increasing the absorption of the amorphous portion and crystal portion and which has a large reflectivity difference, the reflective layer and protective layer are also demanded of a function for preventing the deformation caused by the moisture resistance or heat of the recording thin film as well as a function for controlling the thermal conditions upon recording (c.f. "*Kogaku*" magazine, volume 26, no. 1, pages 9 to 15).

As described above, the protective layer of a high-melting point dielectric must be durable against repeated thermal stress caused by the heating and cooling, must not allow such thermal effect to influence the reflective film or other areas, and it is also required to be thin, of low reflectivity, and possess strength to prevent deterioration. From this perspective, the dielectric protective layer plays an important role.

The dielectric protective layer described above is usually formed with the sputtering method. This sputtering method makes a positive electrode target and a negative electrode target face each other, and generates an electric field by applying a high voltage between the substrates thereof and the targets under an inert gas atmosphere. The sputtering method employs a fundamental principle where plasma is formed pursuant to the collision of electrons, which are ionized at such time, and the inert gas, the positive ion in this plasma extrudes the target structured atoms by colliding with the target (negative electrode) surface, the extruded atoms adhere to the opposing substrate surface and the film is formed.

Conventionally, since the aforementioned protective layer is demanded of permeability, heat resistance, and so on in a visible optical band, sputtering is conducted with a ceramic target such as $ZnS$—$SiO_2$ in order to form a thin film of approximately 500 to 2000 Å. Nevertheless, with these materials, since the bulk resistance of the target is high, deposition cannot be performed with a direct current sputtering device, and, usually, a high frequency sputtering (RF) device is used.

However, not only is this high frequency sputtering (RF) device expensive as a device, it also has numerous problems in that the sputtering efficiency is inferior, power consumption is considerable, control is difficult, and deposition speed is slow. Moreover, in order to increase the deposition speed, when high power is applied thereto, the substrate temperature will rise, and there is a problem in that the polycarbonate substrate will deform.

Further, with respect to the $SiO_2$ employed in the foregoing zinc sulfide-silicic oxide ($ZnS$—$SiO_2$) target, $SiO_2$ having an average grain size of 0.1 to 20 µm at a purity level of 4N or more is ordinarily used, and the target is manufactured by being sintered at 700 to 1200° C.

The target containing $SiO_2$ in ZnS often generates arcing upon forming a film with sputtering, and particles (dust emission) and nodules arise during sputtering as a result thereof, and, not only does this reduce the evenness and quality of the deposition, there is also a problem in that the productivity will also deteriorate.

SUMMARY OF THE INVENTION

An object of the present invention is to provide a sputtering target having zinc sulfide as its principal component which is capable of reducing the influence of heating or the like to the substrate, increasing the deposition speed and thinly adjusting the film thickness upon forming a film with sputtering, and which is capable of reducing particles (dust emission) and nodules that arise during sputtering, which has minimal variation in quality and is capable of improving mass productiveness, and in which the crystal grain is fine and having a high density of 90% or more, preferably 95% or more, and more preferably 98% or more, as well as to an optical recording medium having formed thereon a phase change optical disc protective film having zinc sulfide as its principal component employing this target, and the manufacturing method of such a sputtering target.

In order to achieve the foregoing object, as a result of intense study, the present inventors discovered that, by employing conductive oxide as an additive component to the target, the bulk resistance can be reduced, DC sputtering is enabled thereby, and, without losing the characteristics as a protective film, the generation of particles and nodules can be reduced during sputtering, and the evenness of the film can also be improved.

Based on the foregoing discovery, the present invention provides:

1. A sputtering target and an optical recording medium having formed thereon a phase change optical disc protective film having zinc sulfide as its principal component employing the target, characterized in that the sputtering target has zinc sulfide as its principal component, and is capable of adjusting the refractive index of a film containing conductive oxide in the range of 2.0 to 2.6;
2. A sputtering target and an optical recording medium having formed thereon a phase change optical disc protective film having zinc sulfide as its principal component employing the target according to paragraph 1 above, characterized in that the conductive oxide content is 1 to 50 mol %;
3. A sputtering target and an optical recording medium having formed thereon a phase change optical disc protective film having zinc sulfide as its principal component employing the target according to paragraph 1 or paragraph 2 above, characterized in that the conductive oxide is one or more types selected from indium oxide, tin oxide, and zinc oxide;
4. A sputtering target and an optical recording medium having formed thereon a phase change optical disc protective film having zinc sulfide as its principal component employing the target according to any one of paragraphs 1 to 3 above, further containing one or more types of oxides selected from aluminum oxide, gallium oxide, zirconium oxide, germanium oxide, stibium oxide, and niobium oxide;
5. A sputtering target and an optical recording medium having formed thereon a phase change optical disc protective film having zinc sulfide as its principal component employing the target according to any one of paragraphs 1 to 3 above, characterized in that one or more types of oxides selected from aluminum oxide, gallium oxide, zirconium oxide, germanium oxide, stibium oxide, and niobium oxide are contained at a weight ratio conversion of 0.01 to 20% in relation to the conductive oxide;
6. A sputtering target and an optical recording medium having formed thereon a phase change optical disc protective film having zinc sulfide as its principal component employing the target according to any one of paragraphs 1 to 3 above, further containing glass forming oxide having silicon dioxide as its principal component and containing one or more types selected from aluminum oxide, boric oxide, phosphoric oxide, alkali metal oxide, and alkali earth metal oxide at a weight ratio of 0.1% or more in relation to the silicon dioxide;
7. A sputtering target and an optical recording medium having formed thereon a phase change optical disc protective film having zinc sulfide as its principal component employing the target according to paragraph 6 above, characterized in that glass forming oxide is contained at a molar ratio of 1 to 30% in relation to the total volume;
8. A sputtering target and an optical recording medium having formed thereon a phase change optical disc protective film having zinc sulfide as its principal component employing the target according to any one of paragraphs 1 to 7 above, characterized in that the average crystal grain size of the insulation phase or high resistance phase existing within the target bulk is 5 µm or less;
9. A sputtering target and an optical recording medium having formed thereon a phase change optical disc protective film having zinc sulfide as its principal component employing the target according to any one of paragraphs 1 to 8 above, characterized in that the insulation phase or high resistance phase existing within the target bulk contains one or more types selected from zinc sulfide, silicon dioxide, boric oxide, phosphoric oxide, alkali metal oxide, and alkali earth metal oxide;
10. A sputtering target and an optical recording medium having formed thereon a phase change optical disc protective film having zinc sulfide as its principal component employing the target according to any one of paragraphs 1 to 9 above, characterized in that the relative density is 90% or more;
11. A sputtering target and an optical recording medium having formed thereon a phase change optical disc protective film having zinc sulfide as its principal component employing the target according to any one of paragraphs 1 to 10 above, characterized in that the bulk resistance is 1 Ω cm or less; and
12. A manufacturing method of a sputtering target having zinc sulfide as its principal component according to any one of paragraphs 1 to 11 above, comprising the steps of: evenly mixing the respective component raw material powders; heating this mixed powder to a temperature of 700 to 1200° C. with hot pressing or hot isostatic pressing; and sintering this under a bearing of 100 to 300 kg/cm$^2$.

DETAILED DESCRIPTION OF THE INVENTION

The sputtering target of the present invention has zinc sulfide as its principal component, and further contains conductive oxide. As a result, obtained is a sputtering target having the same characteristics as a protective film equivalent to the ordinarily used ZnS—SiO$_2$, wherein the bulk resistance is 1 Ωcm or less, and DC sputtering is enabled thereby.

In comparison to the foregoing RF sputtering, DC sputtering has superior characteristics in that the deposition speed is fast, and the sputtering efficiency is high. In addition, a DC sputtering device also has advantages in that it is inexpensive, easy to control, and consumes less power.

Further, by making the refractive index greater than the ordinary ZnS—SiO$_2$ (2.0 to 2.1), the film thickness of the protective film itself can be thinned, and thereby yielded is the effect of improved productivity and prevention of substrate heating.

Therefore, as a result of using the sputtering target of the present invention, significant effects are yielded in that the productivity will increase, materials of superior quality can be obtained, and an optical recording medium having an optical disc protective film can be manufactured stably and inexpensively.

It is desirable that the content of conductive oxide in the sputtering target be 1 to 50 mol %. The reason for making the content 1 to 50 mol % is to obtain conductivity while maintaining the characteristics of the ZnS itself.

Moreover, the conductive oxide is selected from indium oxide, tin oxide and zinc oxide. Further, it is also possible to contain one or more types of oxides selected from aluminum oxide, gallium oxide, zirconium oxide, germanium oxide, stibium oxide, and niobium oxide. It is desirable that these oxides are contained at a weight ratio conversion of 0.01 to 20% in relation to the conductive oxide.

Oxides are contained to dissolve oxides having a valence different than the conductive oxide and generate non-stoichiometry. As a result, numerous conduction electron holes can be made, and an effect of increasing the amorphism of the film can also be expected. In this case, it is particularly desirable to dissolve the oxide in advance prior to mixing it with ZnS.

Further, the lower limit upon containing oxide at a weight ratio conversion of 0.01 to 20% in relation to the conductive oxide is for acquiring the effect of addition, and the upper limit is because the influence on the optical characteristics of the film cannot be ignored.

Moreover, the sputtering target of the present invention may also contain silicon dioxide. When silicon dioxide is contained, there is an advantage in that the optical characteristics, thermal conductivity and the like may be adjusted to be equivalent to that of ZnS—$SiO^2$.

When silicon dioxide is contained, although there is a drawback in that this often becomes the source of abnormal discharge in direct current sputtering, this drawback can be overcome by containing one or more types selected from aluminum oxide, boric oxide, phosphoric oxide, alkali metal oxide, and alkali earth metal oxide at a weight ratio of 0.1% or more in relation to the silicon dioxide. Thus, it is effective to add silicon dioxide which yields the effect in that the optical characteristics, thermal conductivity and the like may be adjusted to be equivalent to that of ZnS—$SiO^2$.

Further, it is desirable that glass forming oxide is contained at a molar ratio of 1 to 30% in relation to the total volume. As a result, a film equivalent to ZnS—$SiO^2$ can be obtained without causing abnormal discharge.

It is desirable that the average crystal grain size of the insulation phase or high resistance phase existing within the target bulk is 5 μm or less. As a result, an effect of suppressing abnormal discharge can be obtained.

Moreover, it is also possible to obtain a target of the present invention having a relative density of 90% or more and a high density of 95% or more. As a result, particles (dust emission) and nodules can be reduced during sputtering, minimal variation in quality is enabled, and mass productiveness is improved.

The manufacturing method of the sputtering target according to the present invention involves the steps of: evenly mixing the respective component raw material powders; heating this mixed powder to a temperature of 700 to 1200° C. with hot pressing or hot isostatic pressing; and sintering this under a bearing of 100 to 300 kg/cm².

As a result, it is possible to manufacture a sputtering target having zinc sulfide as its principal component wherein the relative density of the sintered body is 90% or more, and even 95% or more, and wherein the bulk resistance is 1 Ωcm or less.

The increase in density of the sputtering target having zinc sulfide as its principal component according to the present invention reduces pores and miniaturizes the crystal grains, and thereby makes the sputtering face of the target even and smooth, whereby yielding a significant effect of reducing particles and nodules during sputtering as well as prolonging the target life.

EXAMPLES AND COMPARATIVE EXAMPLES

The present invention is now described with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Example 1

Indium oxide ($In_2O_3$) powder having a purity of 4N (99.99%) was evenly mixed with zinc sulfide (ZnS) powder having a purity of 4N (99.99%) at a ratio of 20 mol % in relation to ZnS.

This mixed powder was filled in a graphite die, and hot pressed under the conditions of a vacuum atmosphere, a bearing of 200 kg/cm², and a temperature of 1000° C. The bulk body obtained thereby had a relative density of 98%, and a resistance of $2.5 \times 10^{-3}$ Ωcm.

A target was prepared from this bulk body, and, upon conducting a sputtering test, DC sputtering could be easily performed, and a sputtering target for forming a phase change optical disc protective film containing conductive oxide and having high density ZnS with superior characteristics as its principal component was obtained. The transmittance of the film was 93% and the refractive index thereof was 2.3.

Example 2

ITO ($In_2O_3$-10 wt % $SnO_2$) powder having a purity of 4N (99.99%) was evenly mixed with zinc sulfide (ZnS) powder having a purity of 4N (99.99%) at a ratio of 30 mol % in relation to ZnS.

This mixed powder was filled in a graphite die, and hot pressed under the conditions of a vacuum atmosphere, a bearing of 200 kg/cm², and a temperature of 1100° C. The bulk body obtained thereby had a relative density of 97%, and a resistance of $4.7 \times 10^{-3}$ Ωcm.

A target was prepared from this bulk body, and, upon conducting a sputtering test, DC sputtering could be easily performed, and a sputtering target for forming a phase change optical disc protective film containing conductive oxide and having high density ZnS with superior characteristics as its principal component was obtained. The transmittance of the film was 88% and the refractive index thereof was 2.4.

Example 3

Indium oxide ($In_2O_3$) powder and zirconium oxide ($ZrO_2$) powder having a purity of 4N (99.99%) were evenly mixed with zinc sulfide (ZnS) powder having a purity of 4N (99.99%) at a ratio of 20 mol % in relation to ZnS.

This mixed powder was filled in a graphite die, and hot pressed under the conditions of a vacuum atmosphere, a bearing of 200 kg/cm², and a temperature of 1000° C. The bulk body obtained thereby had a relative density of 100%, and a resistance of $1.4 \times 10^{-2}$ Ωcm.

A target was prepared from this bulk body, and, upon conducting a sputtering test, DC sputtering could be easily performed, and a sputtering target for forming a phase change optical disc protective film containing high density ZnS with superior characteristics as its principal component was obtained. The transmittance of the film was 95% and the refractive index thereof was 2.3.

Example 4

Indium oxide ($In_2O_3$) powder and zirconium oxide ($ZrO_2$) powder having a purity of 4N (99.99%) were evenly mixed with zinc sulfide (ZnS) powder having a purity of 4N (99.99%) at a ratio of 20 mol % in relation to ZnS, and silicate glass was evenly mixed thereto at a ratio of 20 mol % in relation to ZnS. The composition of silicate glass is $SiO_2$-0.2 wt % $Al_2O_3$-0.1 wt % $Na_2O_3$.

This mixed powder was filled in a graphite die, and hot pressed under the conditions of a vacuum atmosphere, a bearing of 200 kg/cm$^2$, and a temperature of 1100° C. The bulk body obtained thereby had a relative density of 100%, and a resistance of $5.4 \times 10^{-2}$ Ωcm.

A target was prepared from this bulk body, and, upon conducting a sputtering test, DC sputtering could be easily performed, and a sputtering target for forming a phase change optical disc protective film containing high density ZnS with superior characteristics as its principal component was obtained. The transmittance of the film was 95% and the refractive index thereof was 2.3.

Example 5

ATO ($SnO_2$-10 wt % $Sb_2O_3$) powder having a purity of 4N (99.99%) was evenly mixed with zinc sulfide (ZnS) powder having a purity of 4N (99.99%) at a ratio of 30 mol % in relation to ZnS.

This mixed powder was filled in a graphite die, and hot pressed under the conditions of a vacuum atmosphere, a bearing of 200 kg/cm$^2$, and a temperature of 800° C. The bulk body obtained thereby had a relative density of 95%, and a resistance of $5.2 \times 10^{-1}$ Ωcm.

A target was prepared from this bulk body, and, upon conducting a sputtering test, DC sputtering could be easily performed, and a sputtering target for forming a phase change optical disc protective film containing high density ZnS with superior characteristics as its principal component was obtained. The transmittance of the film was 85% and the refractive index thereof was 2.4.

Example 6

INO ($In_2O_3$-5 wt % $Nb_2O_5$) powder having a purity of 4N (99.99%) was evenly mixed with zinc sulfide (ZnS) powder having a purity of 4N (99.99%) at a ratio of 20 mol % in relation to ZnS.

This mixed powder was filled in a graphite die, and hot pressed under the conditions of a vacuum atmosphere, a bearing of 200 kg/cm$^2$, and a temperature of 1100° C. The bulk body obtained thereby had a relative density of 98%, and a resistance of $3.5 \times 10^{-2}$ Ωcm.

A target was prepared from this bulk body, and, upon conducting a sputtering test, DC sputtering could be easily performed, and a sputtering target for forming a phase change optical disc protective film containing high density ZnS with superior characteristics as its principal component was obtained. The transmittance of the film was 90% and the refractive index thereof was 2.3.

Example 7

GZO (ZnO-2 wt % $Ga_2O_3$) powder having a purity of 4N (99.99%) was evenly mixed with zinc sulfide (ZnS) powder having a purity of 4N (99.99%) at a ratio of 20 mol % in relation to ZnS.

This mixed powder was filled in a graphite die, and hot pressed under the conditions of a vacuum atmosphere, a bearing of 200 kg/cm$^2$, and a temperature of 1100° C. The bulk body obtained thereby had a relative density of 96%, and a resistance of $6.8 \times 10^{-2}$ Ωcm.

A target was prepared from this bulk body, and, upon conducting a sputtering test, DC sputtering could be easily performed, and a sputtering target for forming a phase change optical disc protective film containing high density ZnS with superior characteristics as its principal component was obtained. The transmittance of the film was 95% and the refractive index thereof was 2.2.

Comparative Example 1

Indium oxide ($In_2O_3$) powder having a purity of 4N (99.99%) and silicon dioxide ($SiO_2$) powder having a purity of 4N (99.99%) were evenly mixed with zinc sulfide (ZnS) powder having a purity of 4N (99.99%) at respective compositional ratios of 20 mol % and 10 mol % in relation to ZnS.

This mixed powder was filled in a graphite die, and hot pressed under the conditions of a vacuum atmosphere, a bearing of 200 kg/cm$^2$, and a temperature of 1000° C. The bulk body obtained thereby had a relative density of 98%, and a resistance of $2.0 \times 10^{-1}$ Ωcm.

A target was prepared from this bulk body, and, upon conducting a sputtering test, abnormal discharge occurred with DC sputtering. Incidentally, the generation of particles (dust emission) and nodules increased. As described above, with the conditions of Comparative Example 1, in addition to the evenness and quality of the deposition deteriorating, there was a problem in that the productivity also deteriorated.

This was not suitable as a sputtering target for forming a ZnS—$In_2O_3$—$SiO_2$ phase change optical disc protective film.

Comparative Example 2

ITO ($In_2O_3$-10 wt % $SnO_2$) powder having a purity of 4N (99.99%) and silicon dioxide ($SiO_2$) powder having a purity of 4N (99.99%) were evenly mixed with zinc sulfide (ZnS) powder having a purity of 4N (99.99%) at respective compositional ratios of 20 mol % and 20 mol % in relation to ZnS.

This mixed powder was filled in a graphite die, and hot pressed under the conditions of a vacuum atmosphere, a bearing of 200 kg/cm$^2$, and a temperature of 1100° C. The bulk body obtained thereby had a relative density of 100%, and a resistance of $1.4 \times 10^{-1}$ Ωcm.

A target was prepared from this bulk body, and, upon conducting a sputtering test, abnormal discharge occurred with DC sputtering. Incidentally, the generation of particles (dust emission) and nodules increased. As described above, with the conditions of Comparative Example 2, in addition to the evenness and quality of the deposition deteriorating, there was a problem in that the productivity also deteriorated.

This was not suitable as a sputtering target for forming a ZnS—In$_2$O$_3$—SnO$_2$—SiO$_2$ phase change optical disc protective film.

Comparative Example 3

IZO (In$_2$O$_3$-5 wt % ZrO$_2$) powder having a purity of 4N (99.99%) and silicon dioxide (SiO$_2$) powder having a purity of 4N (99.99%) were evenly mixed with zinc sulfide (ZnS) powder having a purity of 4N (99.99%) at respective compositional ratios of 20 mol % and 20 mol % in relation to ZnS.

This mixed powder was filled in a graphite die, and hot pressed under the conditions of a vacuum atmosphere, a bearing of 200 kg/cm$^2$, and a temperature of 1100° C. The bulk body obtained thereby had a relative density of 99%, and a resistance of $1.0 \times 10^{-2}$ Ωcm.

A target was prepared from this bulk body, and, upon conducting a sputtering test, abnormal discharge occurred with DC sputtering. Incidentally, the generation of particles (dust emission) and nodules increased. As described above, with the conditions of Comparative Example 3, in addition to the evenness and quality of the deposition deteriorating, there was a problem in that the productivity also deteriorated.

This was not suitable as a sputtering target for forming a ZnS—In$_2$O$_3$—ZrO$_2$—SiO$_2$ phase change optical disc protective film.

Compositions and attributes of foregoing Examples 1 to 7 and Comparative Examples 1 to 3 are shown in Table 1. As illustrated in the foregoing Examples, by making zinc sulfide the principal component and making this contain conductive oxide, it has become evident that effects are yielded in which the bulk resistance can be reduced, DC sputtering will be enabled, and, without losing the characteristics as a protective film, the generation of particles and nodules during sputtering can be reduced, and the evenness of the film thickness can also be improved.

Moreover, although foregoing Examples 1 to 7 show representative examples of the target composition of the present invention, similar results were obtained with other target compositions included in the present invention.

Contrarily, with Comparative Examples 1 to 3, since SiO2 was added as is, although the bulk resistance decreased, problems arose in which abnormal discharge occurred during sputtering, the generation of particles and nodules increased as a result thereof, and characteristics as a phase change optical disc protective film were also lost. Accordingly, it is evident that the sputtering target of the present invention having zinc sulfide as its principal component is extremely effective as a target for forming a phase change optical disc protective film.

TABLE 1

| Examples | ZnS Mol % | Conductive Oxide Mol % | Glass Forming Oxide Mol % | Density (%) | Bulk Resistance Ω cm | Sputtering Assessment | Transmittance % | Refractive Index |
|---|---|---|---|---|---|---|---|---|
| Example 1 | 80 | In$_2$O$_3$ 20 | 0 | 98 | $2.5 \times 10^{-2}$ | DC Possible | 93 | 2.3 |
| Example 2 | 70 | ITO 30 | 0 | 97 | $4.7 \times 10^{-2}$ | DC Possible | 88 | 2.4 |
| Example 3 | 80 | IZO 20 | 0 | 100 | $1.4 \times 10^{-2}$ | DC Possible | 95 | 2.3 |
| Example 4 | 60 | IZO 20 | Silicate Glass 20 | 100 | $5.4 \times 10^{-2}$ | DC Possible | 95 | 2.3 |
| Example 5 | 70 | ATO 30 | 0 | 95 | $5.2 \times 10^{-1}$ | DC Possible | 85 | 2.4 |
| Example 6 | 80 | INO 20 | 0 | 98 | $3.5 \times 10^{-2}$ | DC Possible | 90 | 2.3 |
| Example 7 | 80 | GZO 20 | 0 | 96 | $6.8 \times 10^{-2}$ | DC Possible | 95 | 2.2 |
| Comparative Example 1 | 70 | In$_2$O$_3$ 20 | Pure SiO$_2$ 10 | 98 | $2.0 \times 10^{-1}$ | Abnormal Discharge | 95 | 2.2 |
| Comparative Example 2 | 60 | ITO 20 | Pure SiO$_2$ 20 | 100 | $1.4 \times 10^{-1}$ | Abnormal Discharge | 90 | 2.3 |
| Comparative Example 3 | 60 | IZO 20 | Pure SiO$_2$ 20 | 99 | $1.0 \times 10^{-2}$ | Abnormal Discharge | 98 | 2.2 |

ITO: In$_2$O$_3$-10 wt % SnO$_2$
IZO: In$_2$O$_3$-5 wt % ZrO$_2$
ATO: SnO$_2$-10 wt % Sb$_2$O$_3$
INO: In$_2$O$_3$-5 wt % Nb$_2$O$_5$
GZO: ZnO-2 wt % Ga$_2$O$_3$
Silicate Glass: SiO$_2$-0.2 wt % Al$_2$O$_3$-0.1 wt % Na$_2$O$_3$ The present invention enables DC sputtering upon forming a film with sputtering, and yields a significant effect of realizing facilitated control, increasing the deposition speed and improving the sputtering efficiency, which are the characteristics of DC sputtering. Moreover, since the refractive index can also be increased, the use of this sputtering target yields a significant effect in that the productivity can be improved, materials of superior quality can be acquired, and an optical recording medium having an optical disc protective film can be manufactured stably at a low cost.

Further, significant effect is yielded in that it is possible to manufacture a sputtering target having zinc sulfide as its principal component and a high density of a relative density of 90% or more in which particles (dust emission) and nodules during sputtering can be reduced, the variations in quality are minimal, productivity can be improved, the number of pores is few, the crystal grains are fine, and to obtain an optical recording medium having formed thereon a phase change optical disc protective film having zinc sulfide as its principal component employing such a target without losing the characteristics as a protective film.

The invention claimed is:

1. A sputtering target for use in forming a phase change optical disc protective film of an optical recording medium, comprising:
    a sputtering target having zinc sulfide as its principal component, 1 to 50 mol % of at least one conductive oxide selected from a group consisting of indium oxide, tin oxide, and zinc oxide, and at least one additional oxide selected from a group consisting of aluminum oxide, gallium oxide, zirconium oxide, germanium oxide, stibium oxide, and niobium oxide, wherein said sputtering target is adapted for use in forming a film having zinc sulfide as its principal component and a refractive index in a range of 2.0 to 2.6.

2. A sputtering target according to claim 1, wherein said at least one additional oxide contained in said target is contained relative to said conductive oxide at a weight ratio conversion of 0.01 to 20%.

3. A sputtering target according to claim 2, wherein said target has one of an insulation phase and a high resistance phase existing therein that contains zinc sulfide.

4. A sputtering target according to claim 2, wherein said sputtering target has a relative density of at least 90%.

5. A sputtering target according to claim 2, wherein said sputtering target has a bulk resistance of 1 $\Omega$cm or less.

6. A sputtering target according to claim 2, wherein said target has one of an insulation phase and a high resistance phase existing therein with an average crystal grain size of 5 μm or less.

7. A sputtering target according to claim 6, wherein said one of said insulation phase and said high resistance phase contains zinc sulfide.

8. A sputtering target according to claim 7, wherein said sputtering target has a relative density of at least 90%.

9. A sputtering target according to claim 8, wherein said sputtering target has a bulk resistance of 1 $\Omega$cm or less.

10. A sputtering target according to claim 1, wherein said target has one of an insulation phase and a high resistance phase existing therein with an average crystal grain size of 5 μm or less.

11. A sputtering target according to claim 10, wherein said one of said insulation phase and said high resistance phase contains zinc sulfide.

12. A sputtering target according to claim 11, wherein said sputtering target has a relative density of at least 90%.

13. A sputtering target according to claim 12, wherein said sputtering target has a bulk resistance of 1 $\Omega$cm or less.

14. A sputtering target according to claim 1, wherein said target has one of an insulation phase and a high resistance phase existing therein that contains zinc sulfide.

15. A sputtering target according to claim 1, wherein said sputtering target has a relative density of at least 90%.

16. A sputtering target according to claim 1, wherein said sputtering target has a bulk resistance of 1 $\Omega$cm or less.

17. An optical recording medium having a phase change optical disc protective film formed thereon, said film having zinc sulfide as its principal component and a refractive index in a range of 2.0 to 2.6, said film being a sputtered film formed by a sputtering target having zinc sulfide as its principal component, 1 to 50 mol % of at least one conductive oxide selected from a group consisting of indium oxide, tin oxide, and zinc oxide, and at least one additional oxide selected from a group consisting of aluminum oxide, gallium oxide, zirconium oxide, germanium oxide, stibium oxide, and niobium oxide.

18. A method of manufacturing a sputtering target, comprising the steps of:

evenly mixing respective component raw material powders;

heating the mixed powders to a temperature of 700 to 1200° C. by one of hot pressing and hot isostatic pressing; and sintering the mixed powders under a bearing of 100 to 300 kg/cm$^2$, such that the sputtering target produced has zinc sulfide as its principal component, 1 to 50 mol % of at least one conductive oxide selected from a group consisting of indium oxide, tin oxide, and zinc oxide, and at least one additional oxide selected from a group consisting of aluminum oxide, gallium oxide, zirconium oxide, germanium oxide, stibium oxide, and niobium oxide.

19. A method according to claim 18, wherein said at least one additional oxide contained in said target is contained relative to said conductive oxide at a weight ratio conversion of 0.01 to 20%.

* * * * *